United States Patent
Li et al.

(10) Patent No.: US 11,234,331 B2
(45) Date of Patent: Jan. 25, 2022

(54) MULTILAYER PRINTED CIRCUIT BOARD AND METHOD FOR MANUFACTURING THE SAME

(71) Applicants: HongQiSheng Precision Electronics (QinHuangDao) Co., Ltd., Qinhuangdao (CN); Avary Holding (Shenzhen) Co., Limited., Shenzhen (CN)

(72) Inventors: Cheng-Jia Li, Qinhuangdao (CN); Mei Yang, Qinhuangdao (CN)

(73) Assignees: HongQiSheng Precision Electronics (QingHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 0 days.

(21) Appl. No.: 16/887,463

(22) Filed: May 29, 2020

(65) Prior Publication Data

US 2021/0337665 A1    Oct. 28, 2021

(30) Foreign Application Priority Data

Apr. 22, 2020 (CN) .......................... 202010321085.9

(51) Int. Cl.
*H05K 1/09* (2006.01)
*H05K 3/46* (2006.01)
(Continued)

(52) U.S. Cl.
CPC ............... *H05K 1/09* (2013.01); *H05K 1/113* (2013.01); *H05K 1/115* (2013.01); *H05K 3/02* (2013.01);
(Continued)

(58) Field of Classification Search
CPC .......... H05K 1/09; H05K 1/113; H05K 1/115; H05K 3/4608; H05K 3/4673; H05K 3/02;
(Continued)

(56) References Cited

U.S. PATENT DOCUMENTS

| | | | | |
|---|---|---|---|---|
| 5,879,568 | A * | 3/1999 | Urasaki | H05K 3/0035 |
| | | | | 216/18 |
| 2007/0063355 | A1* | 3/2007 | Ueno | H05K 3/4655 |
| | | | | 257/787 |
| 2018/0310406 | A1* | 10/2018 | Ho | H05K 3/027 |

FOREIGN PATENT DOCUMENTS

JP    2005064203 A  *  3/2005

OTHER PUBLICATIONS

Machine Translation of Endo (JP2005064203A) provided with Office Action (Year: 2005).*

* cited by examiner

*Primary Examiner* — Roshn K Varghese
(74) *Attorney, Agent, or Firm* — ScienBiziP, P.C.

(57) ABSTRACT

A multilayer printed circuit board providing large current and high power includes an inner circuit laminated structure, a first adding-layer circuit base board, and second adding-layer circuit base board. The inner circuit laminated structure includes at least one first type and second type conductive circuit layer alternately stacked. The first and second type conductive circuit layer are respectively made of first and second type metal layer, the first and second type metal layer have different etching ability. The second adding-layer circuit base board and the first adding-layer circuit base board are formed on opposite surfaces of the inner circuit laminated structure. The first and second adding-layer circuit base boards are electrically connected to the inner (Continued)

circuit laminated structure. The disclosure also provides a method for manufacturing such multilayer printed circuit board.

4 Claims, 14 Drawing Sheets

(51) Int. Cl.
  *H05K 1/11* (2006.01)
  *H05K 3/02* (2006.01)
(52) U.S. Cl.
  CPC ......... *H05K 3/4608* (2013.01); *H05K 3/4673* (2013.01); *H05K 2201/0352* (2013.01); *H05K 2201/0959* (2013.01); *H05K 2201/09381* (2013.01); *H05K 2201/09518* (2013.01)
(58) Field of Classification Search
  CPC ......... H05K 3/062; H05K 2201/09381; H05K 2201/0959; H05K 2201/09518; H05K 2201/0352; H05K 2201/0361
  See application file for complete search history.

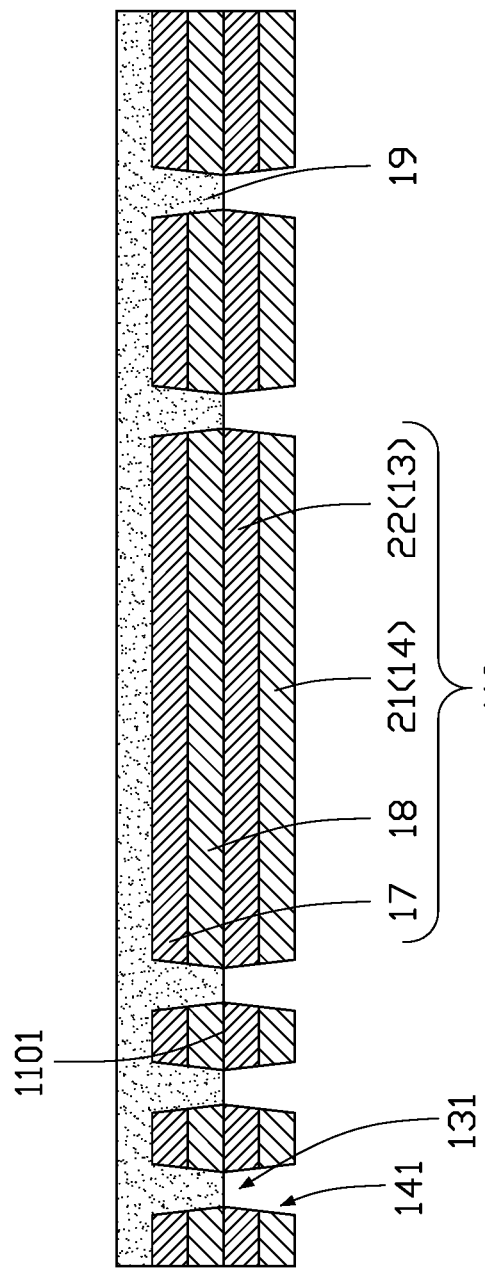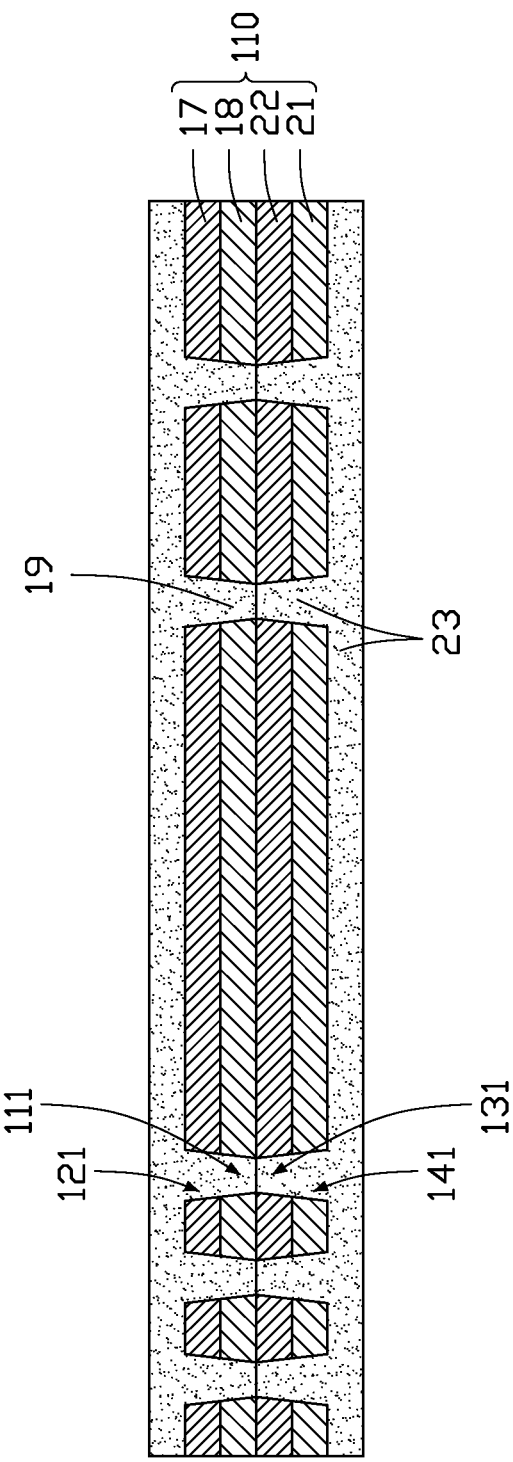

MULTILAYER PRINTED CIRCUIT BOARD AND METHOD FOR MANUFACTURING THE SAME

FIELD

The present disclosure relates to printed circuit boards.

BACKGROUND

Thick copper multilayer printed circuit boards are widely used in automotive electronics, coils, etc. Users have higher functional requirements for the thick copper multi-layer printed circuit boards, such as providing necessary electrical connections and mechanical support, power supply integration, high power, and high reliability for electronic components. Therefore, the thick copper multi-layer printed circuit boards have widening uses, larger profit margins than traditional circuit boards, and large development value.

However, the limitations of etching equipment and process are factors that limit the development of thick copper technology. Specifically, the limitations of the etching equipment and process affect the line width and line spacing of fine traces, these may be substandard and so restrict the design and manufacturing. In addition, the thickness of the multi-layer printed circuit board is such that the aspect ratio of the conductive vias is relatively high. The high aspect ratio affects the fillability of substrate in the conductive vias.

Therefore, there is room for improvement in the art.

BRIEF DESCRIPTION OF THE DRAWINGS

Implementations of the present disclosure will now be described, by way of embodiments, with reference to the attached figures.

FIG. 9 is a cross-sectional view showing a third metal layer and a fourth metal layer of the metal laminated structure etched to form a third conductive circuit layer and a fourth conductive circuit layer, thereby forming an inner circuit laminated structure.

FIG. 10 is a cross-sectional view showing a second adhesive layer pressed on the third conductive circuit layer.

DETAILED DESCRIPTION OF EMBODIMENTS

Figure 1:
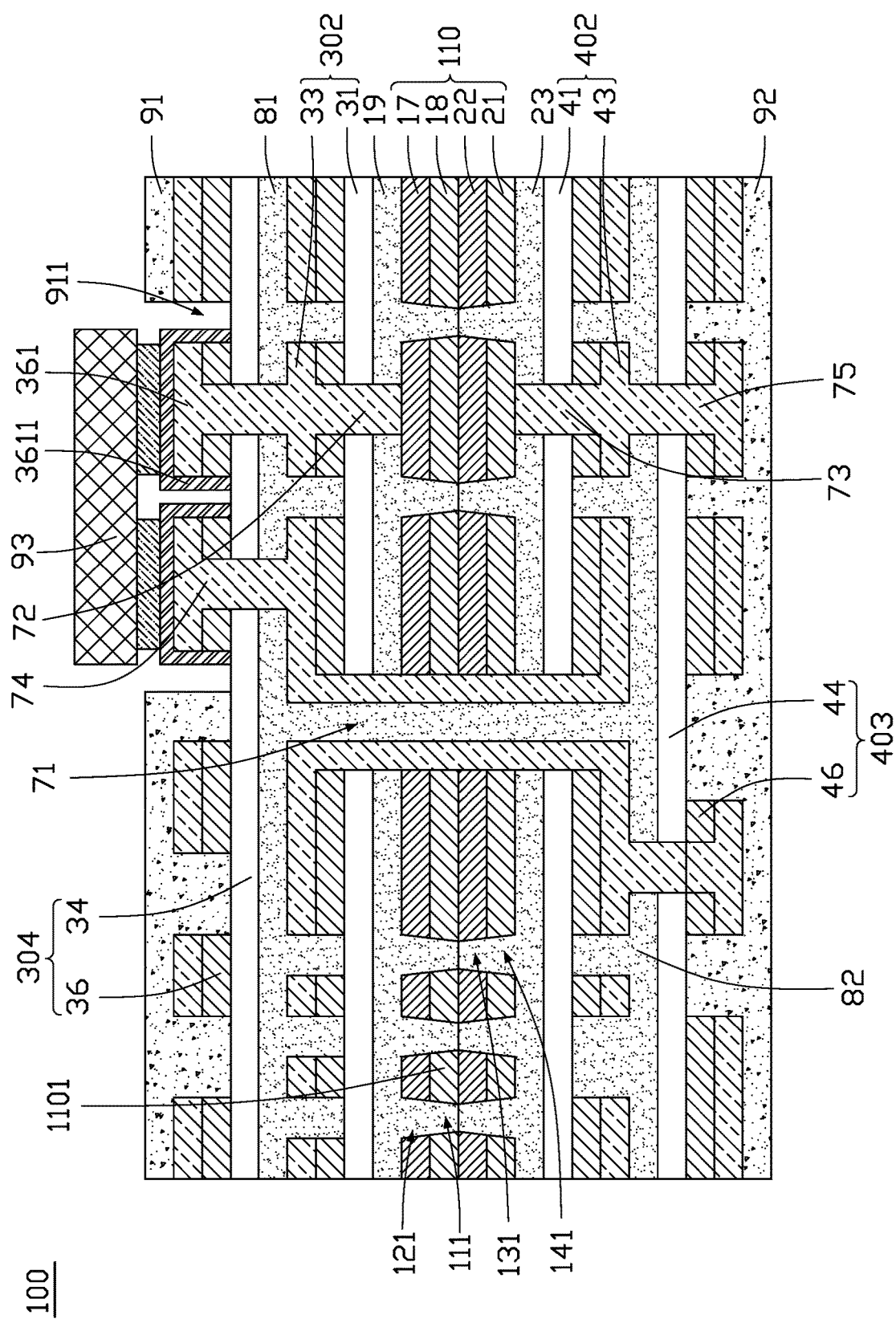
FIG. 1 is a cross-sectional view of a first embodiment of a multilayer printed circuit board according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure Several definitions that apply throughout this disclosure will now be presented.

The term "comprising," when utilized, means "including, but not necessarily limited to"; it specifically indicates open-ended inclusion or membership in the so-described combination, group, series, and the like.

FIG. 1 shows an embodiment of a multilayer printed circuit board 100.

The multilayer printed circuit board 100 includes an inner circuit laminated structure 110, a first adhesive layer 19, a second adhesive layer 23, a first adding-layer circuit base board 302, and a second adding-layer circuit base board 402. The first adhesive layer 19 and the second adhesive layer 23 are formed on opposite surfaces of the inner circuit laminated structure 110. The first adding-layer circuit base board 302 is formed on the first adhesive layer 19. The second adding-layer circuit base board 402 is formed on the second adhesive layer 23.

The inner circuit laminated structure 110 includes at least one first type conductive circuit layer and at least one second type conductive circuit layer, alternately stacked together. The first type conductive circuit layer and the second type conductive circuit layer are respectively made of a first type metal layer and a second type metal layer. The first type metal layer and the second type metal layer have different etching ability. The different etching ability (differential etching) means that a first type etching solution can only etch the second type of metal layer without etching the first type of metal layer, and a second type etching solution can only etch the first type of metal layer without etching the second metal layer.

Due to the different etching ability between the first type metal layer and the second type metal layer, the first type metal layer and the second type metal layer can be etched separately, so that a limitation of a thick metal can be reduced by etching to make the line width and the line distance reach the standard, so that the multilayer printed circuit board 100 can meet the requirements of large current flow and high power.

In addition, a core board is omitted from the inner circuit laminated structure 110, so that the thickness of the multilayer printed circuit board 100 can be reduced, which is advantageous for the multilayer printed circuit board 100 being lighter and thinner.

In addition, since the inner circuit laminated structure 110 is formed of at least two metal layers, the thickness of the inner circuit laminated structure 110 is thicker than the thickness of a conductive circuit layer formed by a general single-layer metal. When the aspect ratio of a through-hole is increased, the success rate of electroplating is improved, which is advantageous for improving the plating ability of through-holes.

In at least one embodiment, a material of the first type metal layer is copper, and a material of the second type metal layer is silver. The silver not only facilitates signal transmission, but also facilitates heat dissipation of the multilayer printed circuit board 100.

In at least one embodiment, the number of the first type conductive circuit layers is the same as the number of the second type conductive circuit layers, that is, the two outermost conductive circuit layers of the inner circuit laminated structure 110 are of the different types.

In at least one embodiment, the inner circuit laminated structure 110 includes two first type conductive circuit layers and two second type conductive circuit layers. Specifically, the inner circuit laminated structure 110 includes a first conductive circuit layer 17, a second conductive circuit layer 18, a third conductive circuit layer 21, and a fourth conductive circuit layer 22. The first conductive circuit layer 17 and the fourth conductive circuit layer 22 belong to the second type conductive circuit layer. The second conductive circuit layer 18 and the third conductive circuit layer 21 belong to the first type conductive circuit layer.

In other embodiments, the inner circuit laminated structure 110 only includes a single first type conductive circuit layer and a single second type conductive circuit layer, or can include more of first type conductive circuit layer and equally more of second type conductive circuit layer.

In at least one embodiment, the inner circuit laminated structure 110 further includes a plurality of inner-layer circuits 1101. Due to the different etching ability between the first type metal layer and the second type metal layer, the inner-layer circuits 1101 has a positive trapezoidal shape or an inverted trapezoidal shape or a funnel shape formed by a positive trapezoidal shape and an inverted trapezoidal shape. Trenches (eg. 111, 121, 131, and 141) are defined between two adjacent inner-layer circuits 1101, and a portion of the first adhesive layer 19 and a portion of the second adhesive layer 23 are infilled in the trenches.

In at least one embodiment, a plurality of first trenches 121 is defined in the first conductive circuit layer 17, and the first trenches 121 form a circuit pattern of the first conductive circuit layer 17.

In at least one embodiment, a plurality of second trenches 111 is defined in the second conductive circuit layer 18, and the second trenches 111 form a circuit pattern of the second conductive circuit layer 18.

In at least one embodiment, a plurality of third trenches 141 is defined in the third conductive circuit layer 21, and the third trenches 141 form a circuit pattern of the third conductive circuit layer 21.

In at least one embodiment, a plurality of fourth trenches 131 is defined in the fourth conductive circuit layer 22, and the fourth trenches 131 form a circuit pattern of the fourth conductive circuit layer 22.

The first trenches 121 and of the second trenches 111 are opposite to each other to form a first type circuit trench of the inner circuit laminated structure 110. The first type circuit trench 121 have an inverted trapezoidal shape. The third trenches 141 and the fourth trenches 131 are opposite to each other to form a second type circuit trench of the inner circuit laminated structure 110. The second type circuit trench has a positive trapezoidal shape. The first type circuit trench and the second type circuit trench have a funnel shape wide at the two ends and narrow at the middle.

The first adhesive layer 19 is formed on the first conductive circuit layer 17, and the second adhesive layer 23 is formed on the third conductive circuit layer 21. The first adhesive layer 19 and the second adhesive layer 23 have low viscosity and partly infill the trenches formed between two adjacent inner-layer circuits 1101. In at least one embodiment, a portion of the first adhesive layer 19 infills in the first trenches 121 and the second trenches 111, and a portion of the second adhesive layer 23 infills in the third trenches 141 and the fourth trenches 131. The first adhesive layer 19 and the second adhesive layer 23 have low viscosity, which not only allows infilling to a high depth ratio and increases reliability of the multilayer printed circuit board 100, but also saves the production process of making jack hole.

The first adding-layer circuit base board 302 includes a first substrate layer 31 and a first adding-layer circuit layer 33. The first substrate layer 31 is formed on the first adhesive layer 19. The first adding-layer circuit layer 33 is formed on the first substrate layer 31.

The second adding-layer circuit base board 402 includes a second substrate layer 41 and a second adding-layer circuit layer 43. The second substrate layer 41 is formed on the second adhesive layer 23. The second adding-layer circuit layer 43 is formed on the second substrate layer 41.

The flowability of the first adhesive layer 19 and the second adhesive layer 23 is better than the flowability of the first substrate layer 31 and the second substrate layer 41.

The multilayer printed circuit board 100 further includes at least one conductive through hole 71, at least one first conductive blind hole 72, and at least one second conductive blind hole 73. The at least one conductive through hole 71 is electrically connected to the inner circuit laminated structure 110, the first adding-layer circuit layer 33, and the second adding-layer circuit layer 43. The at least one first conductive blind hole 72 is electrically connected to the first adding-layer circuit layer 33 and the first conductive circuit layer 17 or to the second conductive circuit layer 18. The at least one second conductive blind hole 73 is electrically connected to the second adding-layer circuit layer 43 and the third conductive circuit layer 21 or to the fourth conductive circuit layer 22.

In at least one embodiment, the at least one first conductive blind hole 72 is electrically connected to the first adding-layer circuit layer 33 and the first conductive circuit layer 17, and the at least one second conductive blind hole 73 is electrically connected to the second adding-layer circuit layer 43 and the third conductive circuit layer 21.

In at least one embodiment, the multilayer printed circuit board 100 further includes a third adhesive layer 81, a fourth adhesive layer 82, a third substrate layer 34, a fourth substrate layer 44, a third adding-layer circuit layer 36, and a fourth adding-layer circuit layer 46. The third adhesive layer 81 is formed on the first adding-layer circuit layer 33. The fourth adhesive layer 82 is formed on the second adding-layer circuit layer 43. The third substrate layer 34 is formed on the third adhesive layer 81. The fourth substrate layer 44 is formed on the fourth adhesive layer 82. The third adding-layer circuit layer 36 is formed on the third substrate layer 34. The fourth adding-layer circuit layer 46 is formed on the fourth substrate layer 44.

A portion of the third adhesive layer 81 and a portion of the fourth adhesive layer 82 infill in the at least one conductive through hole 71. The third adhesive layer 81 and the fourth adhesive layer 82 have low viscosity, to easily infill the at least one conductive through hole 71.

In at least one embodiment, the multilayer printed circuit board 100 further includes at least one third conductive blind hole 74 and at least one fourth conductive blind hole 75. The at least one third conductive blind hole 74 is electrically connected to the first adding-layer circuit layer 33 and the third adding-layer circuit layer 36. The at least one fourth conductive blind hole 75 is electrically connected to the second adding-layer circuit layer 43 and the fourth adding-layer circuit layer 46.

The third substrate layer 34 and the third adding-layer circuit layer 36 define a third adding-layer circuit base board 304. The fourth substrate layer 44 and the fourth adding-layer circuit layer 46 define a fourth adding-layer circuit base board 404.

In other embodiment, the multilayer printed circuit board 100 can omit the third adding-layer circuit base board 304 or the fourth adding-layer circuit base board 404.

In other embodiment, the number of adding-layer circuit base boards of the multilayer printed circuit board 100 is not limited to two or four, but may also include three or more than four. More adding-layer circuit base boards may be layer-added on one or both sides of the third adding-layer circuit base board 304 or the fourth adding-layer circuit base board 404.

In at least one embodiment, the multilayer printed circuit board 100 further includes a first cover film layer 91 and a second cover film layer 92. The first cover film layer 91 and the second cover film layer 92 are formed on the outermost adding-layer circuit base boards of the multilayer printed circuit board 100. In at least one embodiment, the first cover film layer 91 is formed on the third adding-layer circuit layer 36, and the second cover film layer 92 is formed on the fourth adding-layer circuit layer 46.

At least one opening 911 is defined in the first cover film layer 91, a portion of the outermost adding-layer circuit base boards of the multilayer printed circuit board 100 is exposed from the opening 911, to form at least one contacting pad. In at least one embodiment, a portion of the third adding-layer circuit layer 36 is exposed from the opening 911 to form at least one contacting pad 361. At least one gold layer 3611 is formed on the at least one contacting pad 361.

In at least one embodiment, the multilayer printed circuit board 100 further includes at least one electronic component 93. The at least one electronic component 93 is electrically connected to the at least one contacting pad 361.

In other embodiment, the opening 911 also can be defined in the second cover film layer 92.

Figure 2:
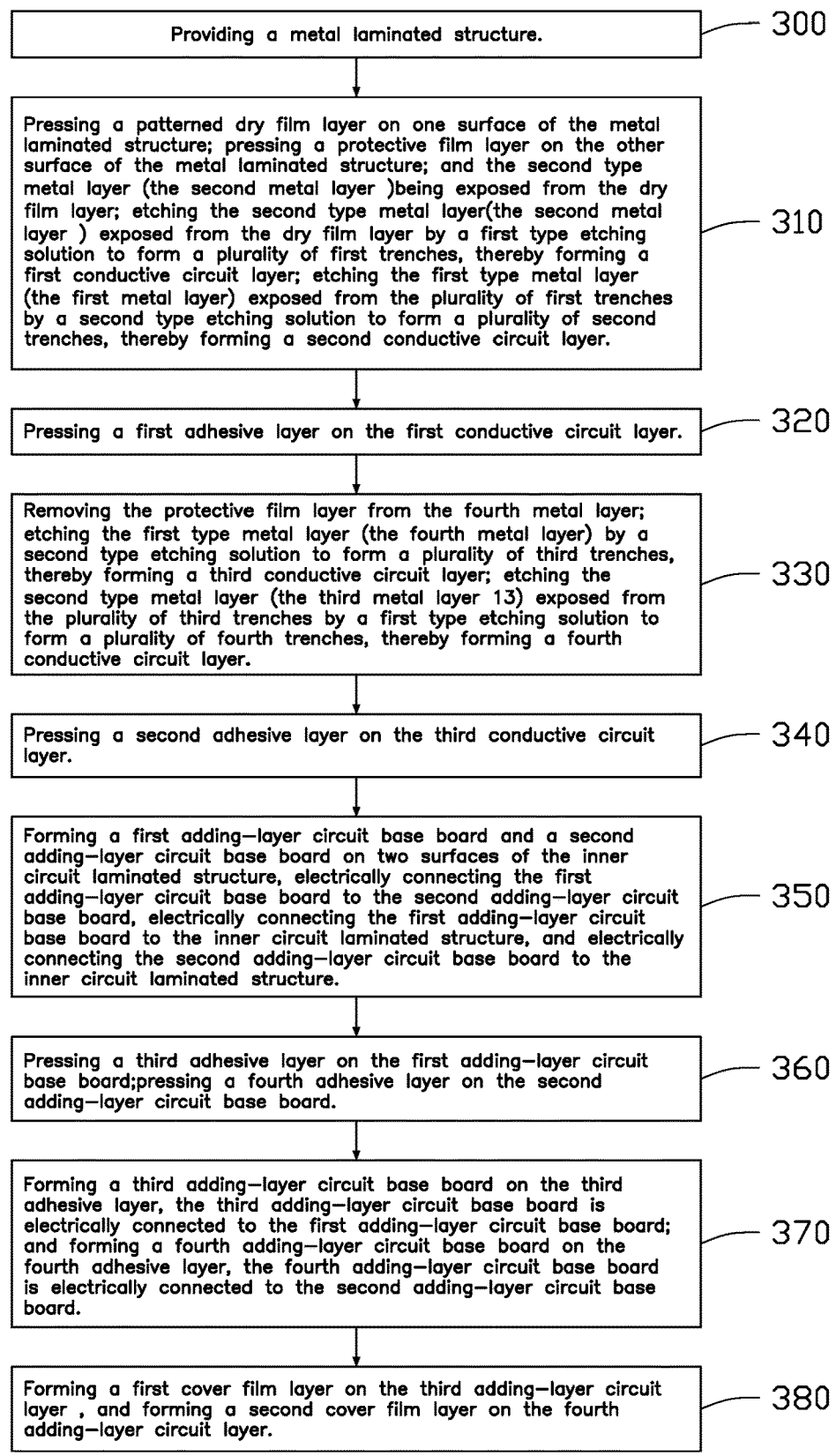
FIG. 2 is a flowchart of a method for manufacturing a multilayer printed circuit board in accordance with an embodiment.

FIG. 2 illustrates a flow chart of a method for manufacturing a multilayer printed circuit board in accordance with an embodiment of the present disclosure. The example method is provided by way of example, as there are a variety of ways to carry out the method. The method described below can be carried out using the configurations illustrated in FIGS. 3-18, for example, and various elements of these figures are referenced in explaining example method. Each block shown in FIG. 2 represents one or more processes, methods, or subroutines, carried out in the example method. Additionally, the illustrated order of blocks is by example only and the order of the blocks can change. The example method can begin at block 300.

Figure 3:
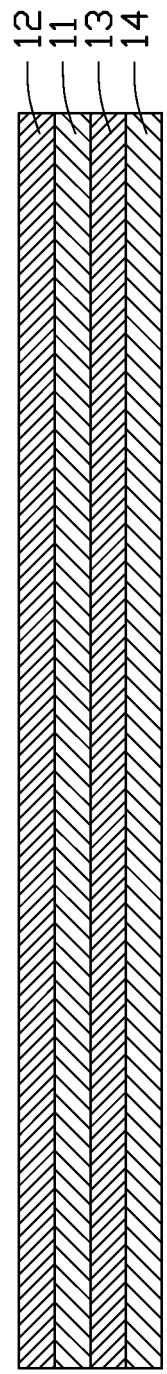
FIG. 3 is a cross-sectional view of a metal laminated structure according to the present disclosure of the multilayer printed circuit board of FIG. 2.
Figure 4:
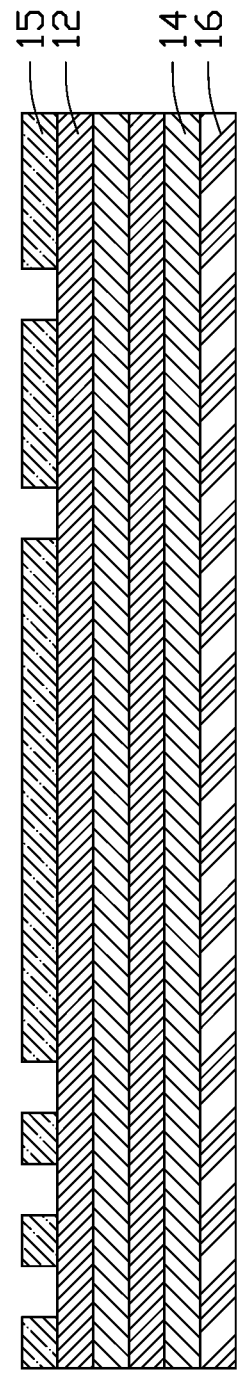
FIG. 4 is a cross-sectional view showing a dry film layer and a protective film layer formed on opposite surfaces of the metal laminated structure of FIG. 3, the dry film layer being exposed and developed to form circuits.
Figure 5:
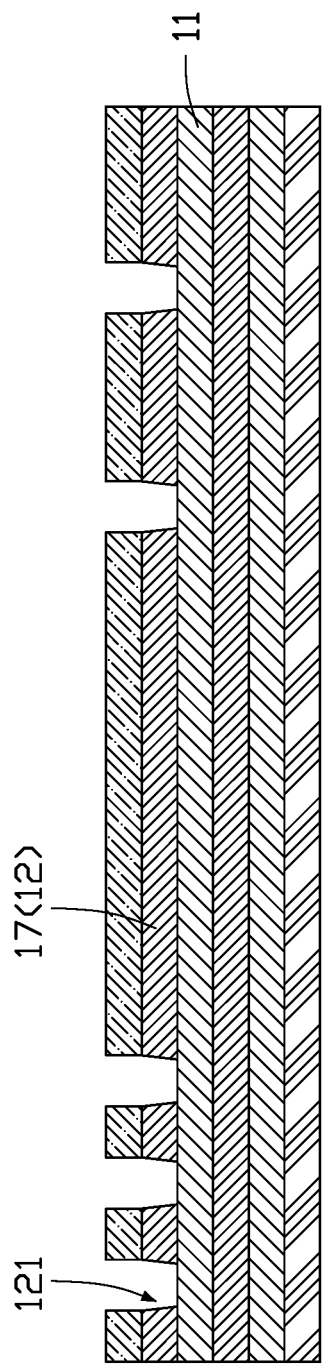
FIG. 5 is a cross-sectional view showing a second metal layer of the metal laminated structure exposed from the dry film layer of FIG. 4 and etched to form a plurality of first trenches and a first conductive circuit layer.
Figure 6:
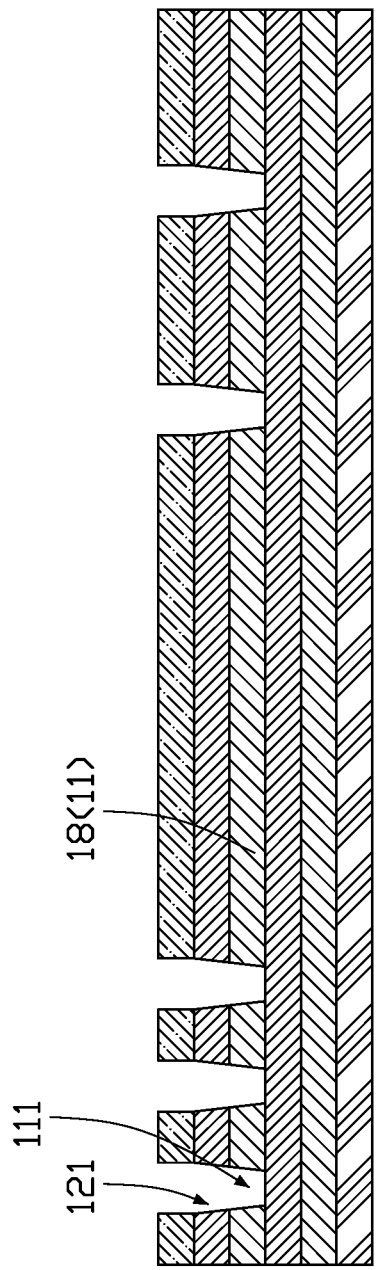
FIG. 6 is a cross-sectional view showing a first metal layer of the metal laminated structure exposed from the first trenches of FIG. 5 and etched to form a plurality of second trenches and a second conductive circuit layer.
Figure 7:
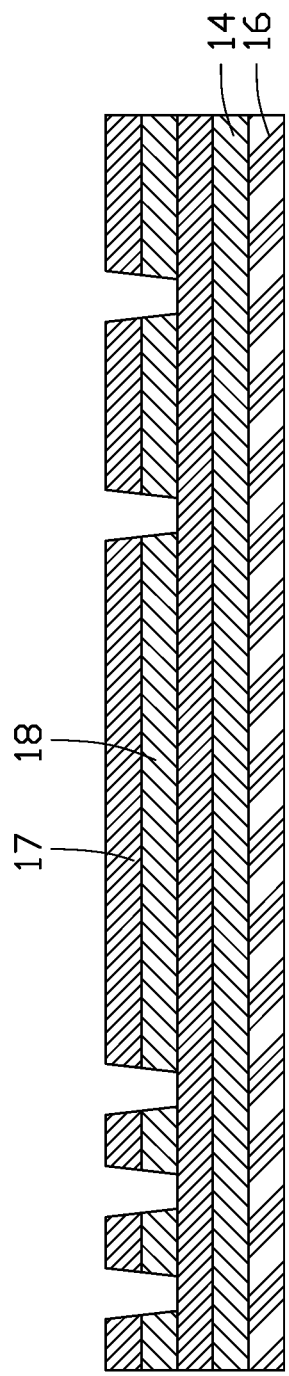
FIG. 7 is a cross-sectional view showing the dry film layer of FIG. 6 removed from the first conductive circuit layer.

At block 300, referring to FIG. 3, a metal laminated structure 10 is provided.

The metal laminated structure 10 includes at least one first type metal layer and at least one second type metal layer that are alternately stacked together. The first type metal layer and the second type metal layer both have different etching ability.

In at least one embodiment, a material of the first type metal layer is copper, and a material of the second type metal layer is silver.

In at least one embodiment, the metal laminated structure 10 includes a first metal layer 11, a second metal layer 12, a third metal layer 13, and a fourth metal layer 14. The second metal layer 12, the first metal layer 11, the third metal layer 13, and the fourth metal layer 14 are alternately stacked together. The first metal layer 11 and the fourth metal layer 14 belong to the first type metal layer. The second metal layer 12 and the third metal layer 13 belong to the second type metal layer.

At block 310, referring to FIGS. 4-7, a patterned dry film layer 15 is pressed on one surface of the metal laminated structure 10, and a protective film layer 16 is pressed on the other surface of the metal laminated structure 10; the dry film layer 15 is opposite to the protective film layer 16; the second type metal layer (the second metal layer 12) is exposed from the dry film layer 15; the second type metal layer (the second metal layer 12) exposed from the dry film layer 15 is etched by a first type etching solution to form a plurality of first trenches 121 on the second type metal layer (the second metal layer 12), thereby forming a first conductive circuit layer 17; the first type metal layer (the first metal layer 11) exposed from the first trenches 121 is etched by a second type etching solution to form a plurality of second trenches 111 on the first type metal layer (the first metal layer 11), thereby forming the first type metal layer (the first metal layer 11) into a second conductive circuit layer 18; the dry film layer 15 is removed from the first conductive circuit layer 17; and the second conductive circuit layer 18 and the first conductive circuit layer 17 define an inner circuit laminated structure 110.

The first type etching solution can only etch the second metal layer 12 (Ag) without etching the first metal layer 11 (copper), and the second type etching solution can only etch the first metal layer 11 without etching the second metal layer 12.

The first trenches 121 is used to define the circuit pattern of the first conductive circuit layer 17. The second trenches 111 is used to define the circuit pattern of the second conductive circuit layer 18.

In at least one embodiment, the first type circuit trench 121 has an inverted trapezoidal shape, and the second trenches 111 has an inverted trapezoidal shape.

Figure 8:
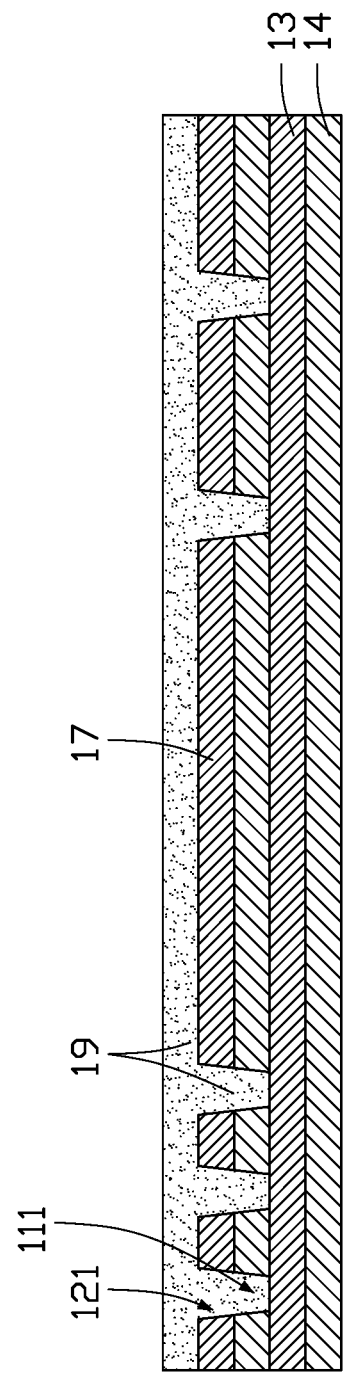
FIG. 8 is a cross-sectional view showing a first adhesive layer pressed on the first conductive circuit layer and infilling the first trenches and the second trenches, the protective film layer of FIG. 7 being removed.

At block 320, referring to FIG. 8, a first adhesive layer 19 is pressed on the first conductive circuit layer 17.

A portion of the first adhesive layer 19 infills in the first trenches 121 and the second trenches 111.

At block 330, referring to FIG. 9, the protective film layer 16 is removed from the fourth metal layer 14; the first type metal layer (the fourth metal layer 14) is etched by a second type etching solution to form a third conductive circuit layer 21; and the second type metal layer (the third metal layer 13) is etched by a first type etching solution to form a fourth conductive circuit layer 22.

A plurality of third trenches 141 are etched by the second type etching solution to define a circuit pattern of the third conductive circuit layer 21. A plurality of fourth trenches 131 are etched by the first type etching solution to define a circuit pattern of the fourth conductive circuit layer 22. The third trenches 141 and the fourth trenches 131 are opposite to each other.

In at least one embodiment, the third trenches 141 and the fourth trenches 131 both have an inverted trapezoidal shape.

The first conductive circuit layer 17, the second conductive circuit layer 18, the third conductive circuit layer 21, and the fourth conductive circuit layer 22 define an inner circuit laminated structure 110.

At block 340, referring to FIG. 10, a second adhesive layer 23 is pressed on the third conductive circuit layer 21.

A portion of the second adhesive layer 23 infills in the third trenches 141 and the fourth trenches 131.

Figure 11:
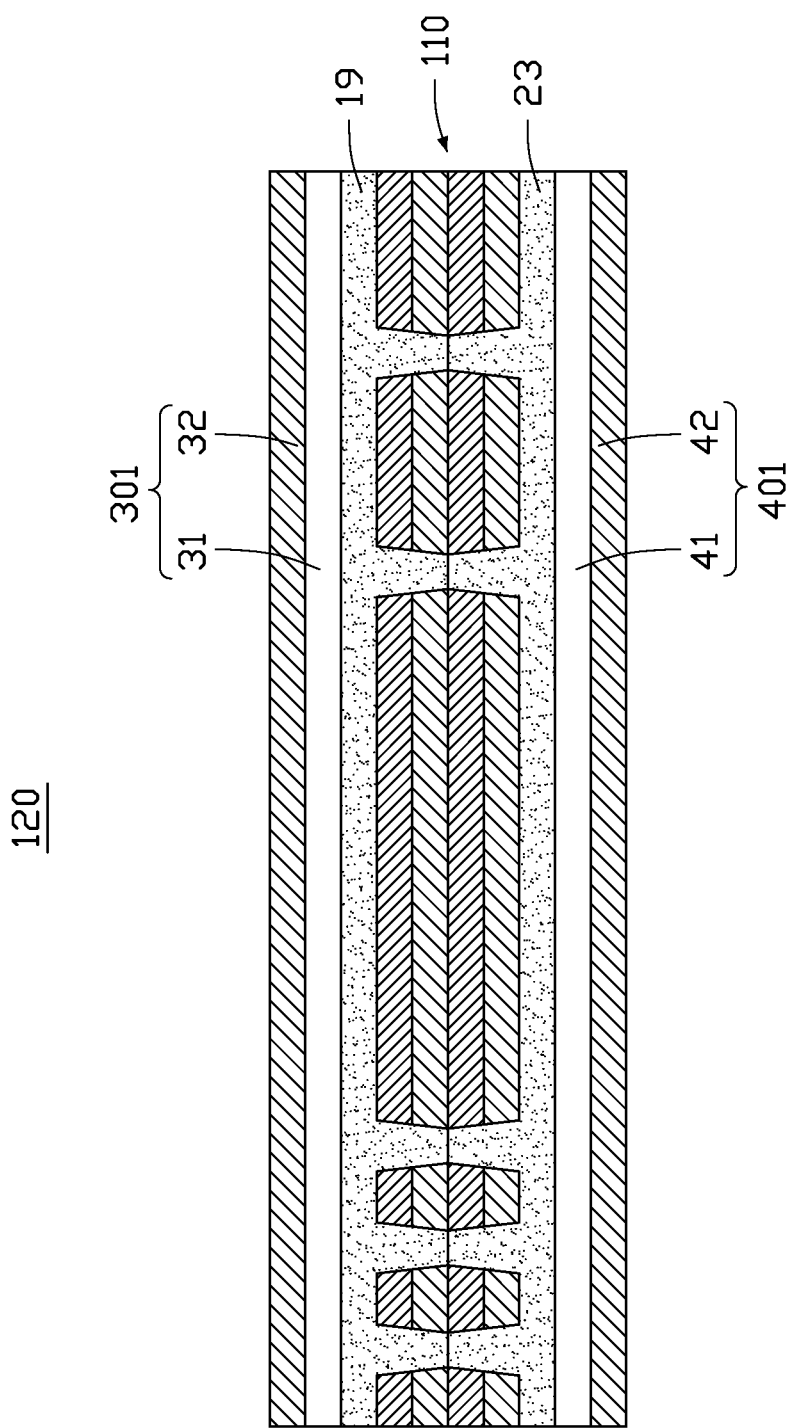
FIG. 11 is a cross-sectional view showing a first copper base board formed on the first adhesive layer, and a second copper base board formed on the second adhesive layer to form a first adding-layer laminated structure.
Figure 12:
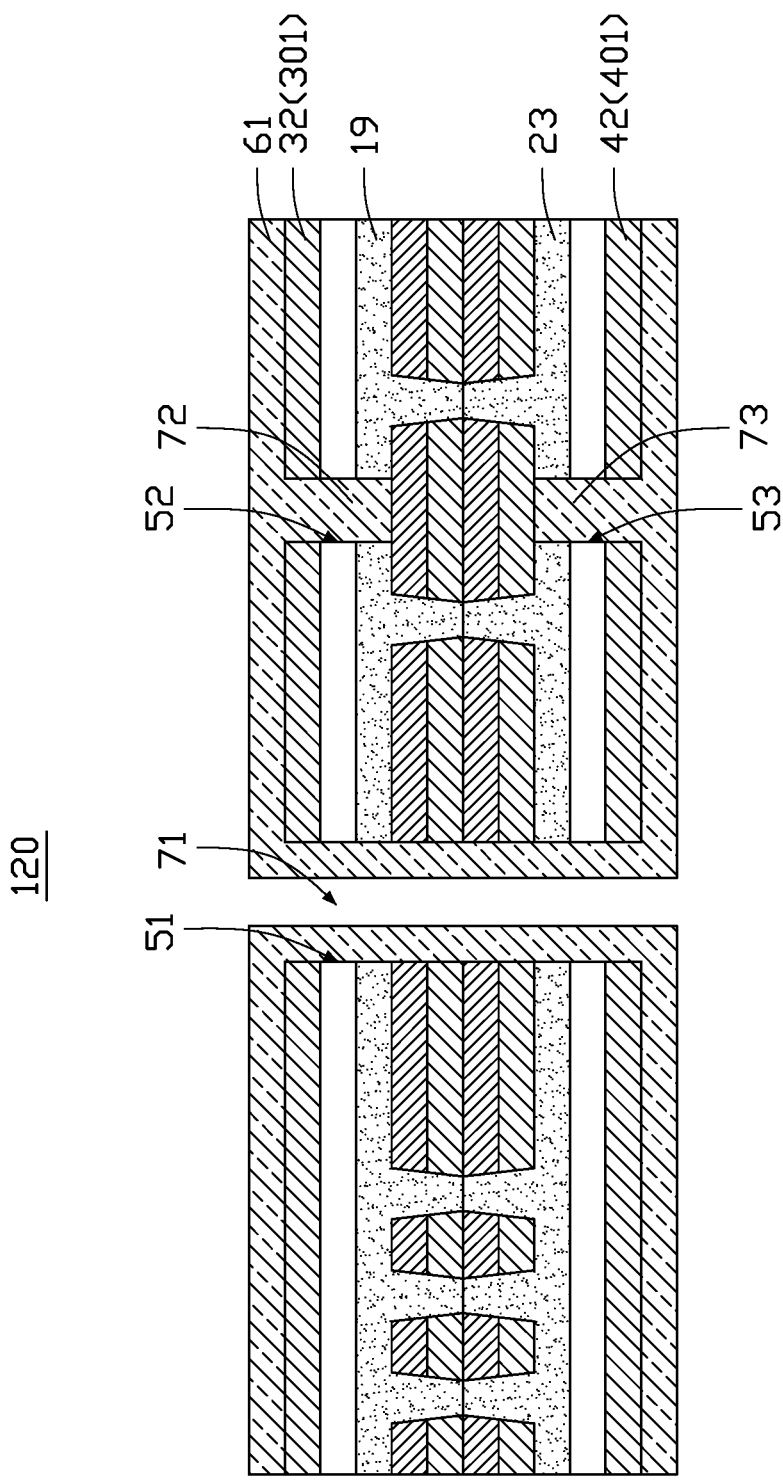
FIG. 12 is a cross-sectional view showing a through hole, a first blind hole, and a second blind hole made respectively into a conductive through hole, a first conductive blind hole, and a second conductive blind hole.
Figure 13:
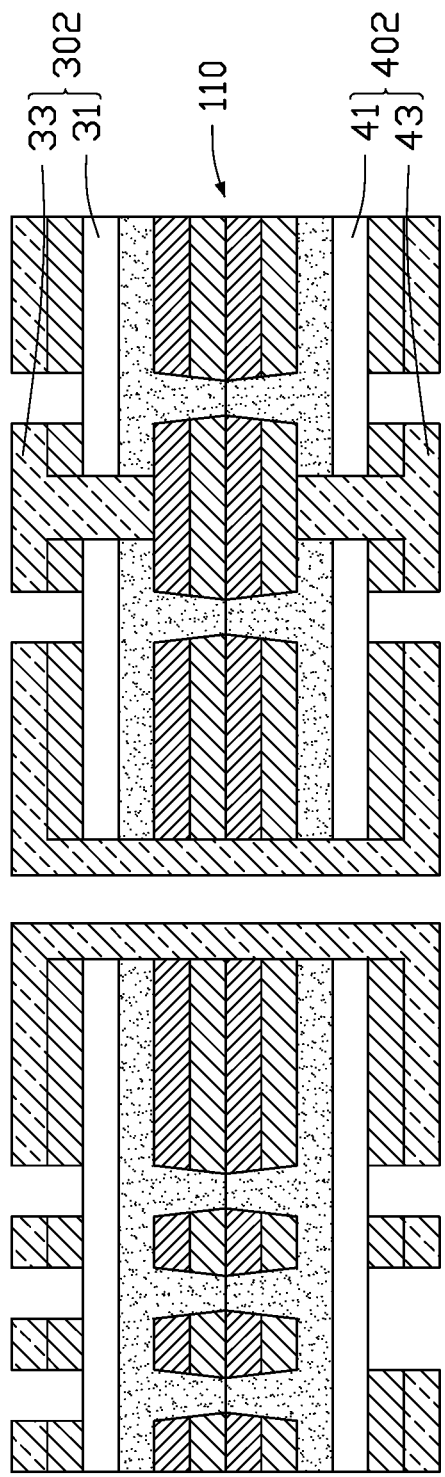
FIG. 13 is a cross-sectional view showing a first copper layer of the first copper base board of FIG. 12 etched to form a first adding-layer circuit layer, and a second copper layer of the second copper base board of FIG. 12 etched to form a second adding-layer circuit layer.

At block 350, referring to FIGS. 11-13, a first adding-layer circuit base board 302 is formed on the first adhesive layer 19, a second adding-layer circuit base board 402 is formed on the second adhesive layer 23, the first adding-layer circuit base board 302 is electrically connected to the second adding-layer circuit base board 402, the first adding-layer circuit base board 302 is electrically connected to the inner circuit laminated structure 110, and the second adding-layer circuit base board 402 is electrically connected to the inner circuit laminated structure 110.

The first adding-layer circuit base board 302 includes a first substrate layer 31 and a first adding-layer circuit layer 33. The first substrate layer 31 is formed on the first adhesive layer 19. The first adding-layer circuit layer 33 is formed on the first substrate layer 31.

The second adding-layer circuit base board 402 includes a second substrate layer 41 and a second adding-layer circuit layer 43. The second substrate layer 41 is formed on the second adhesive layer 23. The second adding-layer circuit layer 43 is formed on the second substrate layer 41.

The block 350 including:

Firstly, referring to FIG. 11, a first copper base board 301 is pressed on the first adhesive layer 19, and a second copper base board 401 is pressed on the second adhesive layer 23 to form a first adding-layer structure 120.

The first copper base board 301 includes a first substrate layer 31 formed on the first adhesive layer 19 and a first copper layer 32 formed on the first substrate layer 31.

The first substrate layer 31 and the first copper layer 32 may be sequentially pressed on the first adhesive layer 19, or may be pressed on the first adhesive layer 19 as a whole.

The second copper base board 401 includes a second substrate layer 41 formed on the second adhesive layer 23 and a second copper layer 42 formed on the second substrate layer 41.

The second substrate layer 41 and the second copper layer 42 may be sequentially pressed on the second adhesive layer 23, or may be pressed on the second adhesive layer 23 as a whole.

Secondly, referring to FIG. 12, at least one through hole 51, at least one first blind hole 52, and at least one second blind hole 53 are defined on the first adding-layer structure 120; and the at least one through holes 51, the at least one first blind hole 52, and the at least one second blind hole 53 are metallized and electroplated to form a first copper plating layer 61 in the at least one through hole 51, the at least one first blind hole 52, and the at least one second blind hole 53, thereby forming at least one conductive through hole 71, at least one first conductive blind hole 72, and at least one second conductive blind hole 73.

The at least one through hole 51, the at least one first blind hole 52, and the at least one second blind hole 53 are formed by mechanical drilling, laser, and so on.

The at least one through hole 51 penetrates the first adding-layer structure 120. The at least one first blind hole 52 penetrates the first copper base board 301 and the first adhesive layer 19. The at least one second blind hole 53 penetrates the second copper base board 401 and the second adhesive layer 23.

In at least one embodiment, the first copper plating layer 61 is formed on an inner wall of the at least one through holes 51, the first copper layer 32, and the second copper layer 42, and infills in the at least one first blind hole 52 and the at least one second blind hole 53.

In other embodiment, the first copper plating layer 61 may be not formed on the first copper layer 32 and the second copper layer 42.

Thirdly, referring to FIG. 13, a first adding-layer circuit layer 33 is formed from the first copper layer 32 by an image transfer process, and the second adding-layer circuit layer 43 is formed from the second copper layer 42 by an image transfer process.

The first substrate layer 31 and the first adding-layer circuit layer 33 define a first adding-layer circuit base board 302. The second substrate layer 41 and the second adding-layer circuit layer 43 define a second adding-layer circuit base board 402.

Figure 14:
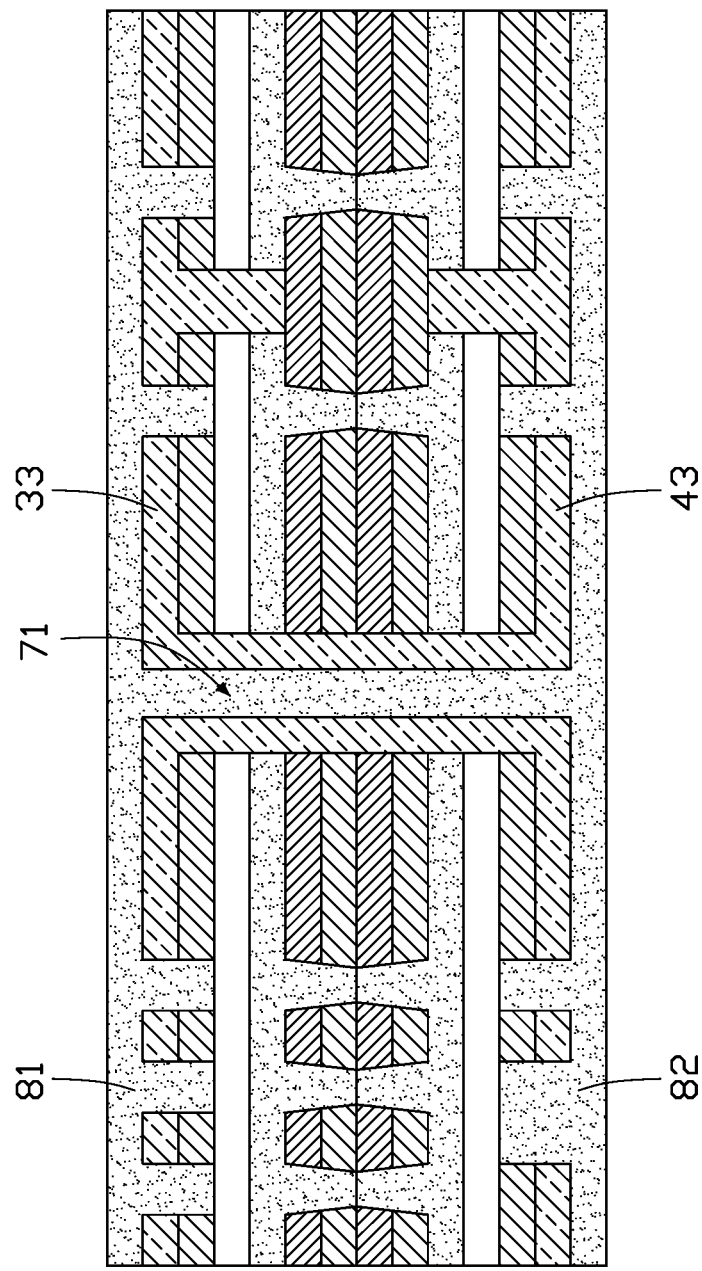
FIG. 14 is a cross-sectional view showing a third adhesive layer pressed on the first adding-layer circuit layer of FIG. 13, and a fourth adhesive layer pressed on the second adding-layer circuit layer of FIG. 13.

At block 360, referring to FIG. 14, a third adhesive layer 81 is pressed on the first adding-layer circuit base board 302, a fourth adhesive layer 82 is pressed on the second adding-layer circuit base board 402.

A portion of the third adhesive layer 81 and a portion of the fourth adhesive layer 82 infill in the at least one conductive through hole 71.

In at least one embodiment, the third adhesive layer 81 is formed on the first adding-layer circuit layer 33, and the fourth adhesive layer 82 is formed on the second adding-layer circuit layer 43.

Figure 15:
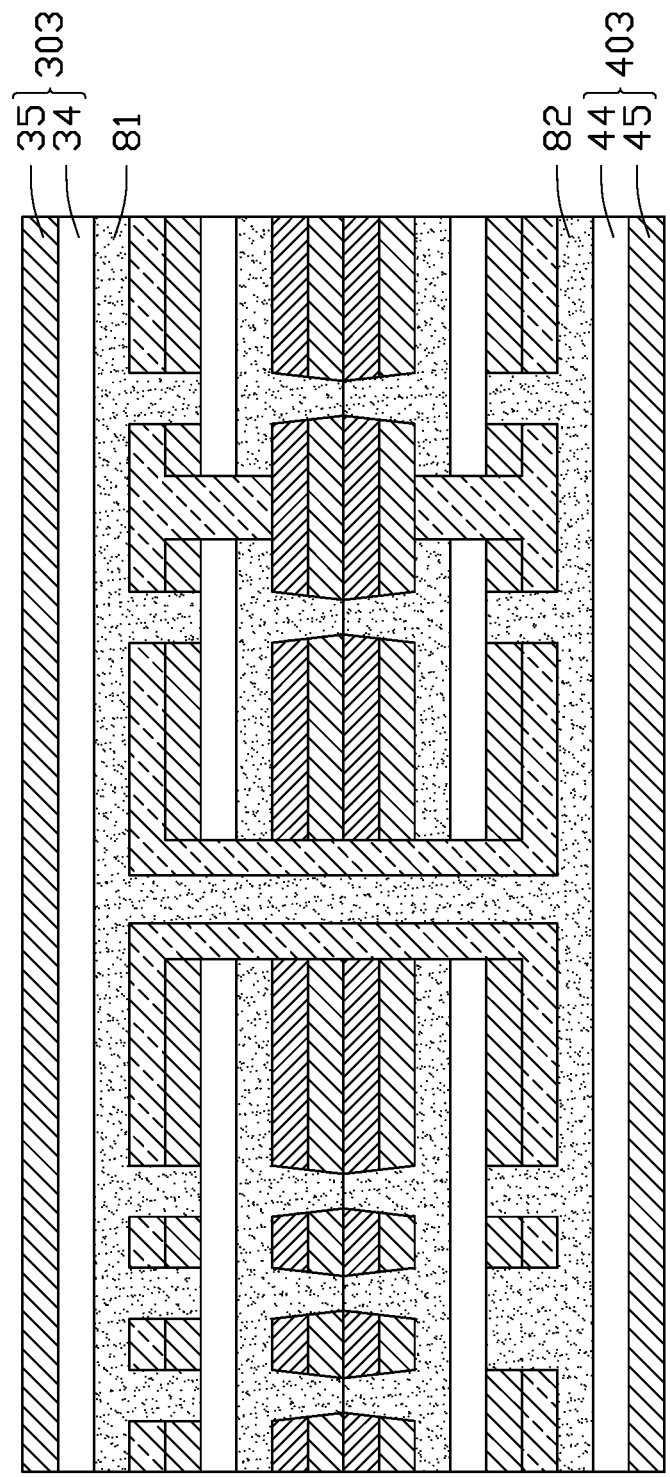
FIG. 15 is a cross-sectional view showing a third copper base board pressed on the third adhesive layer of FIG. 14, and a fourth copper base board pressed on the fourth adhesive layer of FIG. 14 to form a second adding-layer laminated structure.
Figure 16:
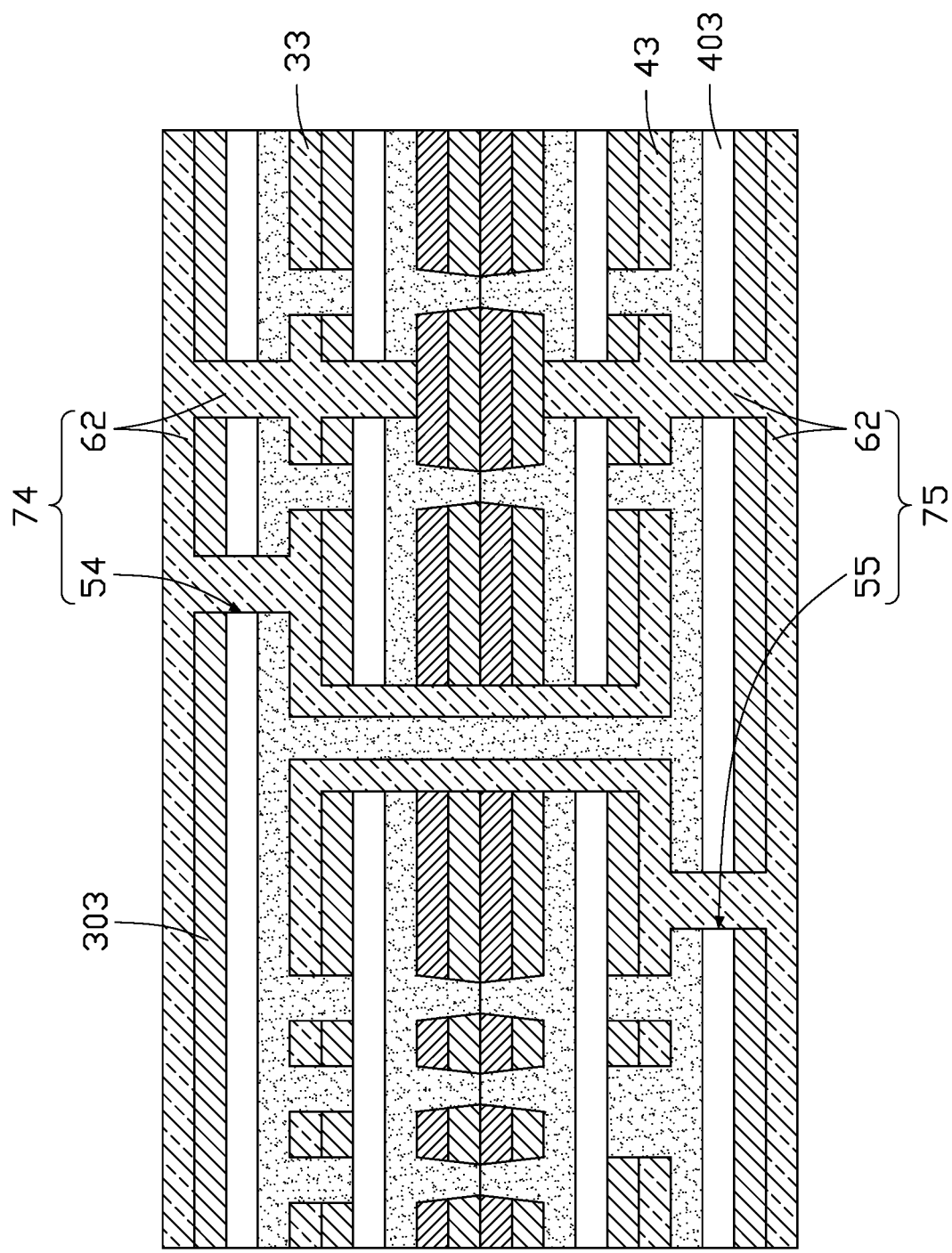
FIG. 16 is a cross-sectional view showing a third blind hole and a fourth blind hole made into a third conductive blind hole and a fourth conductive blind hole by metallizing and copper plating.
Figure 17:
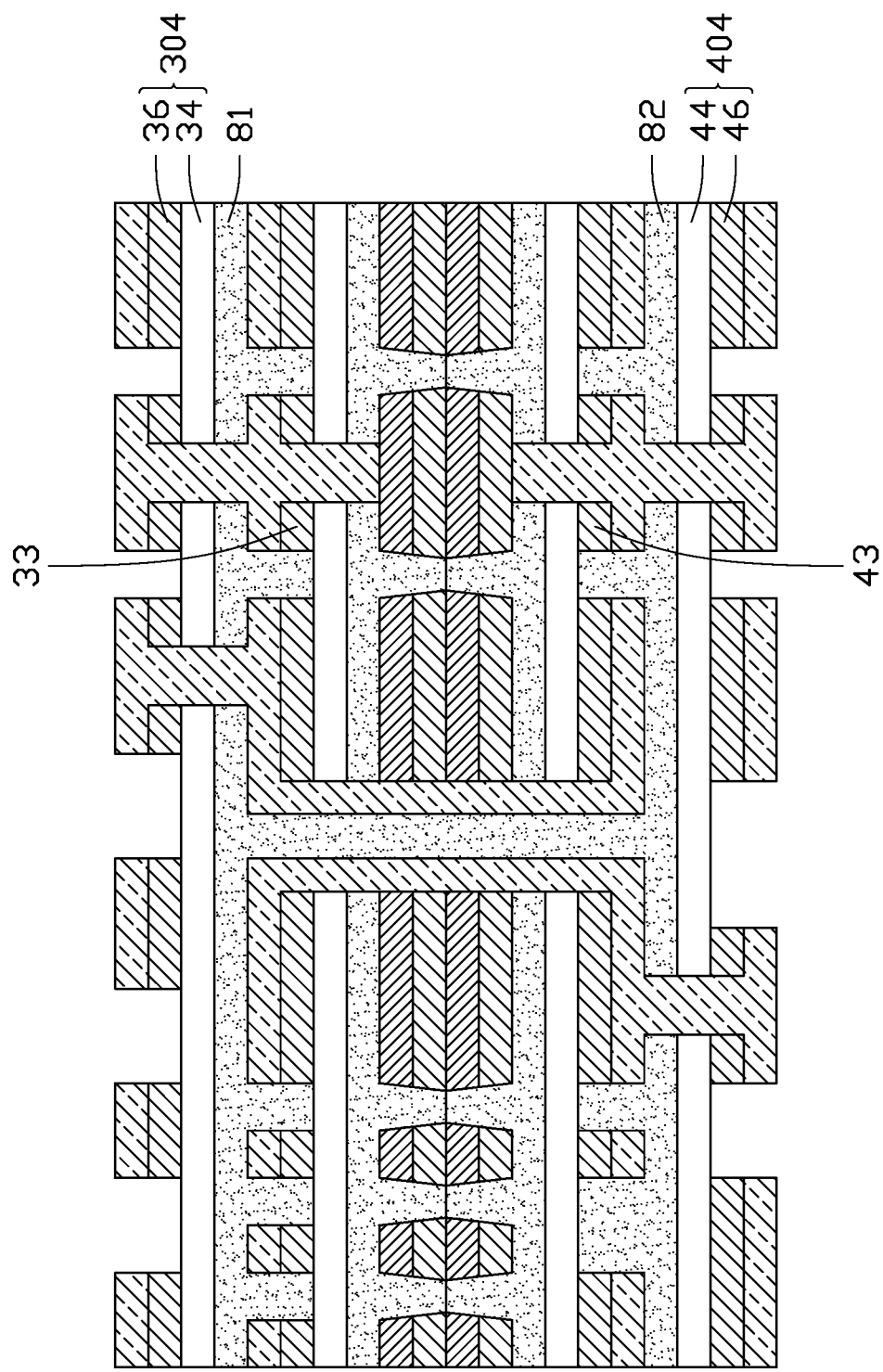
FIG. 17 is a cross-sectional view showing a third copper layer of the third copper clad laminate of FIG. 16 etched to form a third adding-layer circuit layer, and a fourth copper layer of the fourth copper clad laminate of FIG. 16 etched to form a fourth adding-layer circuit layer.

At block 370, referring to FIGS. 15-17, a third adding-layer circuit base board 304 is formed on the third adhesive layer 81, a fourth adding-layer circuit base board 404 is formed on the fourth adhesive layer 82, the third adding-layer circuit base board 304 is electrically connected to the first adding-layer circuit layer 33, and the fourth adding-layer circuit base board 404 is electrically connected to the second adding-layer circuit layer 43.

The third adding-layer circuit base board 304 includes a third substrate layer 34 formed on the third adhesive layer 81 and a third adding-layer circuit layer 36 formed on the third substrate layer 34.

The fourth adding-layer circuit base board 404 includes a fourth substrate layer 44 formed on the fourth adhesive layer 82 and a fourth adding-layer circuit layer 46 formed on the fourth substrate layer 44.

The block 370 including:

Firstly, referring to FIG. 15, a third copper base board 303 is pressed on the third adhesive layer 81, and a fourth copper base board 403 is pressed on the fourth adhesive layer 82 to form a second adding-layer structure 130.

The third copper base board 303 includes a third substrate layer 34 formed on the third adhesive layer 81 and a third copper layer 35 formed on the third substrate layer 34.

The third substrate layer 34 and the third copper layer 35 may be sequentially pressed on the third adhesive layer 81, or may be pressed on the third adhesive layer 81 as a whole.

The fourth copper base board 403 includes a fourth substrate layer 44 formed on the fourth adhesive layer 82 and a fourth copper layer 45 formed on the fourth substrate layer 44.

The fourth substrate layer 44 and the fourth copper layer 45 may be sequentially pressed on the fourth adhesive layer 82, or may be pressed on the fourth adhesive layer 82 as a whole.

Secondly, referring to FIG. 16, at least one third blind hole 54 and at least one fourth blind hole 55 are defined in the second adding-layer structure 130, the at least one third blind hole 54 and the at least one fourth blind hole 55 are metallized and electroplated to form a second copper plating layer 62 in the at least one third blind hole 54 and the at least one fourth blind hole 55, thereby forming at least one third conductive blind hole 74, and at least one fourth conductive blind hole 75.

The at least one third blind hole 54 penetrates the third copper base board 303 and the third adhesive layer 81. The at least one fourth blind hole 55 penetrates the fourth copper base board 403 and the fourth adhesive layer 82.

In at least one embodiment, the second copper plating layer 62 is formed on the third copper layer 35 and the fourth copper layer 45, and infill in the at least one third blind hole 54 and the at least one fourth blind hole 55.

In other embodiment, a second copper plating layer 62 is not formed on the third copper layer 35 and the fourth copper layer 45.

Thirdly, referring to FIG. 17, a third adding-layer circuit layer 36 is formed from the third copper layer 35 by an image transfer process, and the fourth adding-layer circuit layer 46 is formed from the fourth copper layer 45 by an image transfer process.

Figure 18:
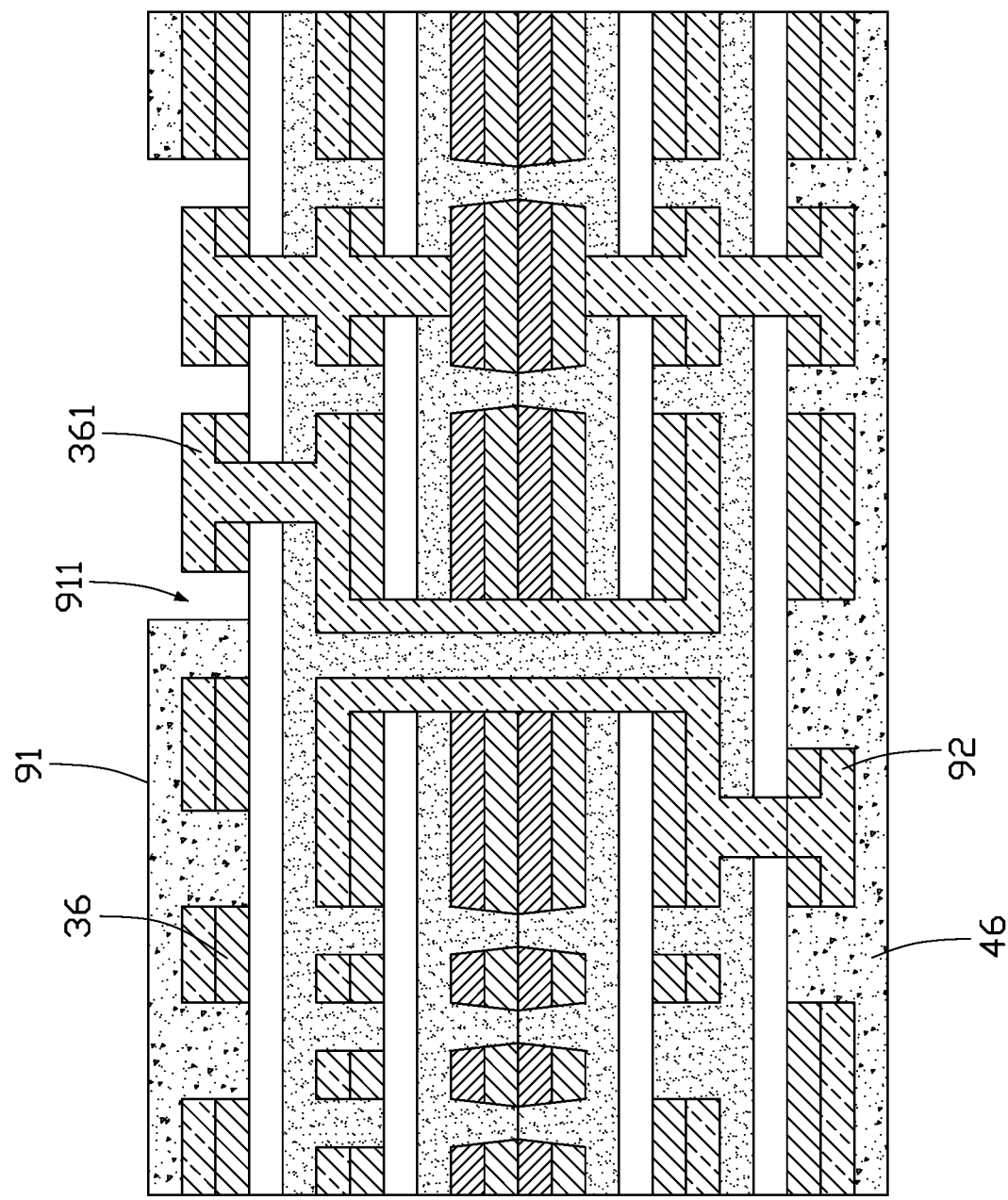
FIG. 18 is a cross-sectional view showing a first cover film layer formed on the third adding-layer circuit layer, and a second cover film layer formed on the fourth adding-layer circuit layer.

At block 380, referring to FIG. 18, a first cover film layer 91 is formed on the third adding-layer circuit layer 36, and a second cover film layer 92 is formed on the fourth adding-layer circuit layer 46.

At least one opening 911 is defined in the first cover film layer 91, a portion of the outermost adding-layer circuit base boards of the multilayer printed circuit board 100 is exposed from the opening 911 to form at least one contacting pad. In at least one embodiment, a portion of the third adding-layer circuit layer 36 is exposed from the opening 911 to form at least one contacting pad 361.

In other embodiment, the opening 911 also can be defined in the second cover film layer 92.

Furthermore, referring to FIG. 1, at least one gold layer 3611 is formed on the at least one contacting pad 361, and at least one electronic component 93 is electrically connected to the at least one contacting pad 361, thereby obtaining a multilayer printed circuit board 100.

Of course, in other embodiments, the multilayer printed circuit board 100 may further include more adding-layer circuit base boards or not include the third adding-layer circuit base board 304 or the fourth adding-layer circuit base board 404.

With the above configuration, due to different etching ability between the first type metal layer and the second type metal layer, the first type metal layer and the second type metal layer can be etched separately, so that a limitation of a thick metal can be reduced by etching to make the line width and the line distance reach the standard, so that the multilayer printed circuit board 100 can meet the requirements of large current flow and high power. In addition, a core board is omitted from the inner circuit laminated structure 110, so that the thickness of the multilayer printed circuit board 100 can be reduced, which is advantageous for the multilayer printed circuit board 100 being lighter and thinner. In addition, since the inner circuit laminated structure 110 is formed of at least two metal layers, the thickness of the inner circuit laminated structure 110 is thicker than the thickness of a conductive circuit layer formed by a general single-layer metal. When the aspect ratio of a through-hole is increased, the success rate of electroplating is improved, which is advantageous for improving the plating ability of through-holes.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A multilayer printed circuit board, comprising:
  an inner circuit laminated structure, wherein the inner circuit laminated structure comprises at least one first type conductive circuit layer and at least one second type conductive circuit layer that are alternately stacked together; the first type conductive circuit layer and the second type conductive circuit layer are respectively made of a first type metal layer and a second type metal layer; and the first type metal layer and the second type metal layer both have different etching ability;
  a first adding-layer circuit base board formed on the inner circuit laminated structure, wherein the first adding-layer circuit base board is electrically connected to the inner circuit laminated structure; and
  a second adding-layer circuit base board formed on the inner circuit laminated structure, wherein the second adding-layer circuit base board and the first adding-layer circuit base board are formed on two opposite surfaces of the inner circuit laminated structure; the second adding-layer circuit base board is electrically connected to the inner circuit laminated structure;

wherein the inner circuit laminated structure comprises a plurality of inner-layer circuits, the inner-layer circuits has a positive trapezoidal shape, an inverted trapezoidal shape, or a funnel shape formed by a positive trapezoidal shape and an inverted trapezoidal shape;

wherein trenches are defined between two adjacent inner-layer circuits; the multilayer printed circuit board further comprises a first adhesive layer and a second adhesive layer, the first adhesive layer is formed between the inner circuit laminated structure and the first adding-layer circuit base board, the second adhesive layer is formed between the inner circuit laminated structure and the second adding-layer circuit base board, a portion of the first adhesive layer and a portion of the second adhesive layer infill in the trenches;

wherein the inner circuit laminated structure comprises a first conductive circuit layer, a second conductive circuit layer, a third conductive circuit layer, and a fourth conductive circuit layer; the first conductive circuit layer and the fourth conductive circuit layer belong to the second type conductive circuit layer, the second conductive circuit layer and the third conductive circuit layer belong to the first type conductive circuit layer;

wherein the first adhesive layer is formed on the first conductive circuit layer, and the second adhesive layer is formed on the third conductive circuit layer;

a plurality of first trenches is defined in the first conductive circuit layer, and the first trenches is used to form a circuit pattern of the first conductive circuit layer; a plurality of second trenches is defined in the second conductive circuit layer, and the second trenches is used to form a circuit pattern of the second conductive circuit layer; a plurality of third trenches is defined in the third conductive circuit layer, and the third trenches is used to form a circuit pattern of the third conductive circuit layer; a plurality of fourth trenches is defined in the fourth conductive circuit layer, and the fourth trenches is used to form a circuit pattern of the fourth conductive circuit layer; a portion of the first adhesive layer infills in the first trenches and the second trenches, and a portion of the second adhesive layer infills in the third trenches and the fourth trenches.

2. The multilayer printed circuit board of claim 1, wherein a material of the first type metal layer is copper, and a material of the second type metal layer is silver.

3. The multilayer printed circuit board of claim 1, wherein the first adding-layer circuit base board comprises a first substrate layer formed on the first adhesive layer, the second adding-layer circuit base board comprises a second substrate layer formed on the second adhesive layer; and the flowability of the first adhesive layer and the second adhesive layer is better than that of the first substrate layer and the second substrate layer.

4. The multilayer printed circuit board of claim 1, wherein the multilayer printed circuit board further comprises at least one conductive through hole, the second adding-layer circuit base board is electrically connected to the first adding-layer circuit base board; and the multilayer printed circuit board further comprises:

a third adhesive layer formed on the first adding-layer circuit base board;

a fourth adhesive layer formed on the second adding-layer circuit base board; a portion of the fourth adhesive layer and a portion of the third adhesive layer infill in the at least one conductive through hole;

a third adding-layer circuit base board formed on the third adhesive layer, the third adding-layer circuit base board is electrically connected to the first adding-layer circuit base board; and a fourth adding-layer circuit base board formed on the fourth adhesive layer, and the fourth adding-layer circuit base board is electrically connected to the second adding-layer circuit base board.

* * * * *